US010692759B2

(12) United States Patent
Jiang et al.

(10) Patent No.: US 10,692,759 B2
(45) Date of Patent: Jun. 23, 2020

(54) METHODS FOR MANUFACTURING AN INTERCONNECT STRUCTURE FOR SEMICONDUCTOR DEVICES

(71) Applicant: Applied Materials, Inc., Santa Clara, CA (US)

(72) Inventors: Hao Jiang, San Jose, CA (US); He Ren, San Jose, CA (US); Hao Chen, Santa Clara, CA (US); Mehul B. Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/037,985

(22) Filed: Jul. 17, 2018

(65) Prior Publication Data

US 2020/0027782 A1 Jan. 23, 2020

(51) Int. Cl.
| | | |
|---|---|---|
| *H01L 21/768* | (2006.01) | |
| *H01L 21/66* | (2006.01) | |
| *H01L 21/02* | (2006.01) | |
| *H01L 21/033* | (2006.01) | |
| *H01L 21/311* | (2006.01) | |
| *H01L 21/3205* | (2006.01) | |
| *H01L 21/3213* | (2006.01) | |

(Continued)

(52) U.S. Cl.
CPC ......... *H01L 21/76832* (2013.01); *C23F 1/00* (2013.01); *H01L 21/0206* (2013.01); *H01L 21/02186* (2013.01); *H01L 21/0338* (2013.01); *H01L 21/31122* (2013.01); *H01L 21/31144* (2013.01); *H01L 21/32051* (2013.01); *H01L 21/32136* (2013.01); *H01L 21/32139* (2013.01); *H01L 21/76877* (2013.01); *H01L 21/76892* (2013.01); *H01L 22/26* (2013.01); *H01L 28/75* (2013.01)

(58) Field of Classification Search
None
See application file for complete search history.

(56) References Cited

U.S. PATENT DOCUMENTS

| 4,536,951 A | 8/1985 | Rhodes et al. |
| 5,236,550 A | 8/1993 | Abt et al. |

(Continued)

FOREIGN PATENT DOCUMENTS

| JP | 3694083 B2 | 9/2005 |
| KR | 10-20050063309 A | 6/2005 |

OTHER PUBLICATIONS

International Search Report and Written Opinion for Application No. PCT/US2019/038590 dated Oct. 14, 2019.

*Primary Examiner* — Jiong-Ping Lu
(74) *Attorney, Agent, or Firm* — Patterson + Sheridan, LLP

(57) ABSTRACT

Generally, embodiments described herein relate to methods for manufacturing an interconnect structure for semiconductor devices, such as in a dual subtractive etch process. An embodiment is a method for semiconductor processing. A titanium nitride layer is formed over a substrate. A hardmask layer is formed over the titanium nitride layer. The hardmask layer is patterned into a pattern. The pattern is transferred to the titanium nitride layer, where the transferring comprises etching the titanium nitride layer. After transferring the pattern to the titanium nitride layer, the hardmask layer is removed, where the removal comprises performing an oxygen-containing ash process.

20 Claims, 10 Drawing Sheets

(51) Int. Cl.
   *C23F 1/00*       (2006.01)
   *H01L 49/02*      (2006.01)

(56) References Cited

U.S. PATENT DOCUMENTS

| | | | |
|---|---|---|---|
| 6,281,585 | B1 | 8/2001 | Bothra |
| 6,326,218 | B1* | 12/2001 | Yunogami ......... H01L 21/32139 257/E21.009 |
| 6,485,990 | B1* | 11/2002 | Lansford ................. H01L 22/20 156/345.24 |
| 6,497,992 | B1 | 12/2002 | Yunogami et al. |
| 6,919,168 | B2* | 7/2005 | Hwang .................... C23F 4/00 216/67 |
| 9,761,489 | B2 | 9/2017 | Mebarki et al. |
| 2002/0060202 | A1 | 5/2002 | Fukunaga et al. |
| 2002/0117471 | A1 | 8/2002 | Hwang et al. |
| 2011/0014779 | A1* | 1/2011 | Makala ................. H01L 27/101 438/478 |
| 2014/0273437 | A1 | 9/2014 | Fuller et al. |
| 2015/0262869 | A1 | 9/2015 | Naik et al. |

* cited by examiner

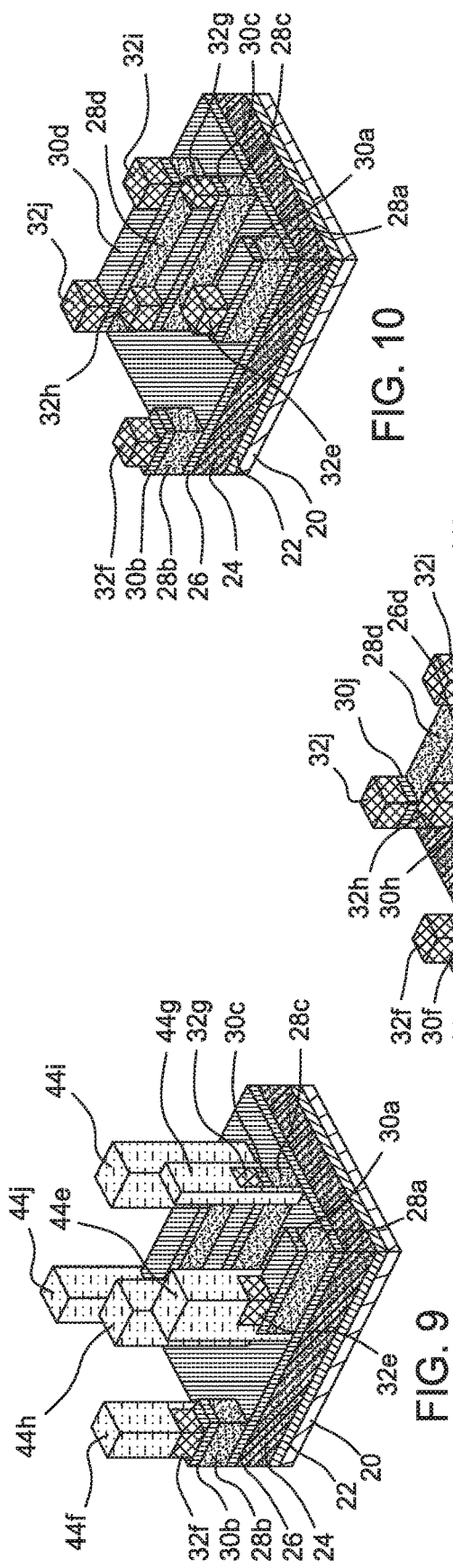
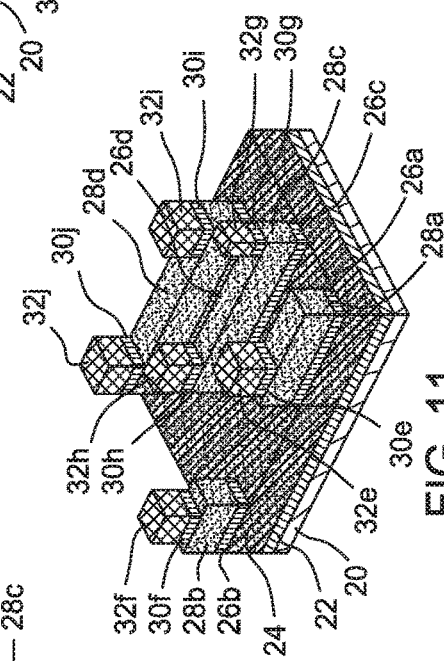
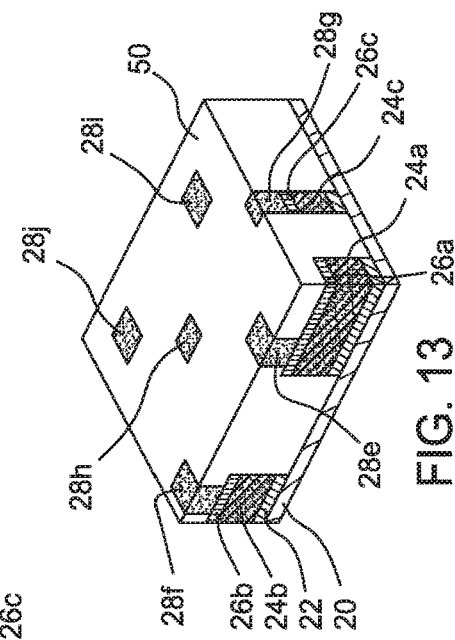
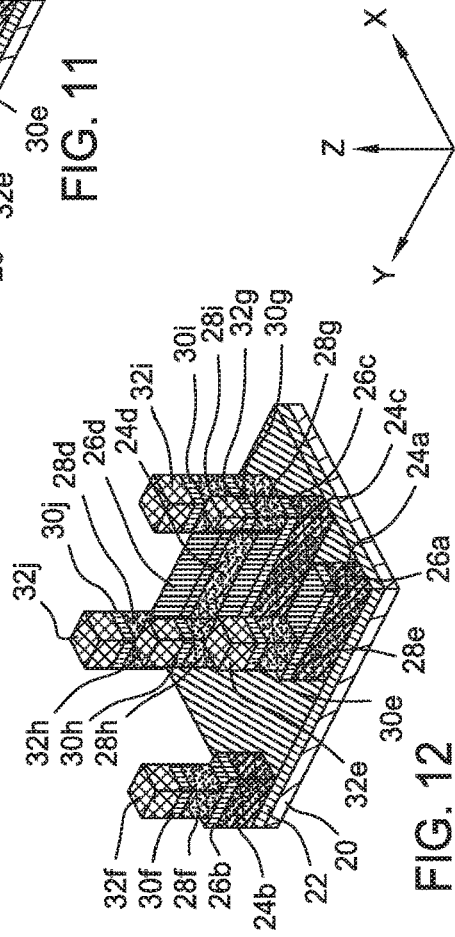
FIG. 9
FIG. 10
FIG. 11
FIG. 12
FIG. 13

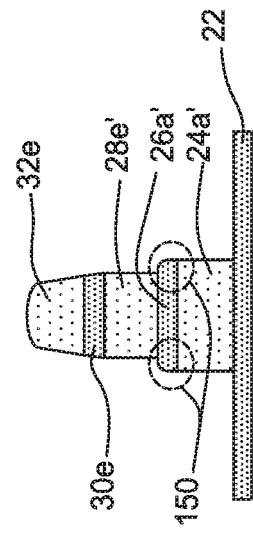
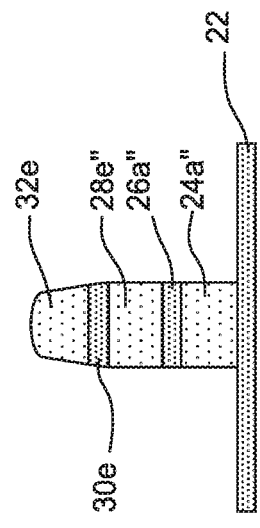
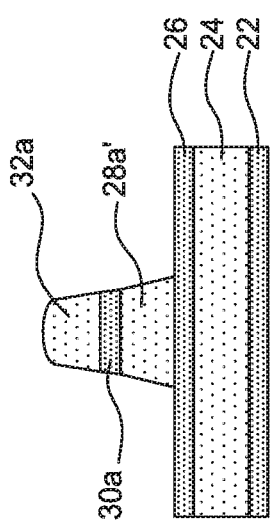
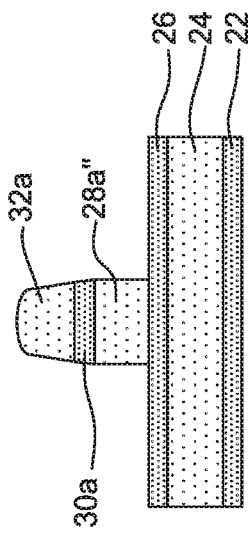

METHODS FOR MANUFACTURING AN INTERCONNECT STRUCTURE FOR SEMICONDUCTOR DEVICES

BACKGROUND

Field

Embodiments described herein generally relate to methods for forming semiconductor devices. More particularly, some embodiments described herein generally relate to methods for manufacturing an interconnect structure for semiconductor devices utilizing, e.g., a dual subtractive etch process.

Description of the Related Art

Reliably producing nanometer and smaller features is one of the key technology challenges for next generation very large scale integration (VLSI) and ultra large-scale integration (ULSI) of semiconductor devices. As the limits of circuit technology are pushed, the shrinking dimensions of VLSI and ULSI interconnect technology have placed additional demands on processing capabilities. As the dimensions of the integrated circuit components are reduced (e.g., in nanometer dimensions), the materials and processes used to fabricate components must be carefully selected in order to obtain satisfactory levels of electrical performance.

SUMMARY OF THE DISCLOSURE

An embodiment is a method for semiconductor processing. A first titanium nitride layer is formed over a substrate. A hardmask layer is formed over the first titanium nitride layer. The hardmask layer is patterned into a first pattern. The first pattern is transferred to the first titanium nitride layer, where the transferring comprises etching the first titanium nitride layer. After transferring the first pattern to the first titanium nitride layer, the hardmask layer is removed, where the removal comprises performing an oxygen-containing ash process.

An embodiment is a method for semiconductor processing. A first ruthenium layer is deposited over a substrate, and the first ruthenium layer is etched. Etching the first ruthenium layer includes: initiating, at a first time, flowing of a mixture of gases to a chamber in which the first ruthenium layer is disposed, determining an end point at a second time using optical emission spectrometry, continuing flowing of the mixture of gases for an over-etch period after the second time, and terminating flowing of the mixture of gases at a conclusion of the over-etch period. The mixture of gases comprises oxygen and chlorine. The end point is determined based on a decrease of a detected optical signal. The over-etch period is in a range from 10% to 100% of a duration from the first time to the second time.

A yet further embodiment is a method for semiconductor processing. A first ruthenium layer is formed over a substrate. A first etch stop layer is formed over the first ruthenium layer. A second ruthenium layer is formed over the first etch stop layer. A second etch stop layer is formed over the second ruthenium layer. A mask layer is formed over the second etch stop layer. A hardmask layer is formed over the mask layer. The hardmask layer and the mask layer are patterned to a line pattern. The line pattern is transferred to the second etch stop layer. After transferring the line pattern to the second etch stop layer, the hardmask layer is removed using an oxygen-containing ash process. After removing the hardmask layer, the line pattern is transferred to the second ruthenium layer. The transferring comprises etching the second ruthenium layer using a gas mixture comprising oxygen and chlorine. In the gas mixture, a ratio of (i) a flow rate of the oxygen to (ii) the flow rate of the oxygen plus a flow rate of the chlorine is in a range from 82% to 95%. Simultaneously, the second etch stop layer is patterned to a via pattern, and the line pattern is transferred to the first etch stop layer. Simultaneously, the via pattern is transferred to the second ruthenium layer to form a via, and the line pattern is transferred to the first ruthenium layer to form a line. A dielectric is formed on the via and line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1 through 13 are perspective views depicting a process of forming a metal interconnect using a dual subtractive etch process according to some embodiments of the present disclosure.

FIGS. 19 and 20 are cross-sectional views illustrating aspects of an etch process according to some embodiments of the present disclosure.

FIGS. 21 and 22 are cross-sectional views illustrating aspects of another etch process according to some embodiments of the present disclosure.

To facilitate understanding, identical reference numerals have been used, wherever possible, to designate identical elements that are common to the figures.

DETAILED DESCRIPTION

Figure 2:
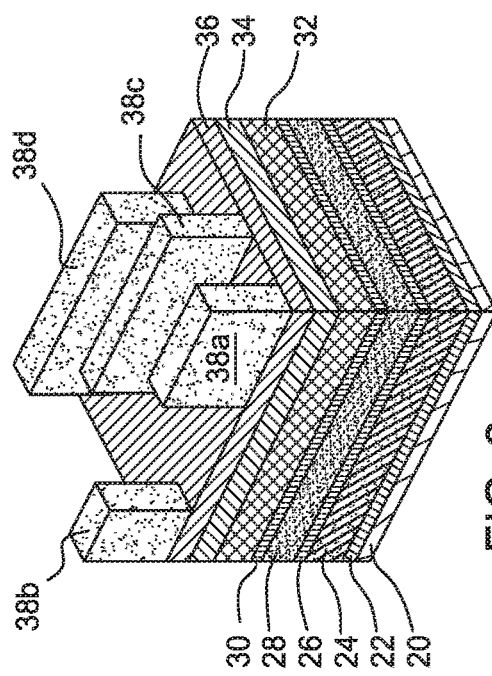

Generally, embodiments described herein relate to methods for manufacturing an interconnect structure for semiconductor devices. The methods described herein are described in the context of a dual subtractive etch process. Various examples implement a film stack including a first metal layer, a first etch stop layer over the first metal layer, a second metal layer over the first etch stop layer, and a second etch stop layer over the second metal layer. In some examples, the first and second metal layers are ruthenium layers, and the first and second etch stop layers are titanium nitride layers. Further, a mask layer (e.g., an oxide layer) is formed on the second etch stop layer. The film stack is patterned using tri-layer masks, each of which can include a hardmask layer.

In some examples, the second etch stop layer (e.g., a titanium nitride layer) is patterned before a hardmask layer of the corresponding tri-layer mask used to pattern the second etch stop layer is removed. By patterning the second etch stop layer before removing the hardmask layer, oxidation of the second etch stop layer may be obviated. Oxidation of the second etch stop layer may prevent proper patterning of the second etch stop layer.

In some examples, the first metal layer (e.g., a ruthenium layer) is etched using a mixture of gases comprising oxygen and chlorine. A ratio of the flow rate of the oxygen in the mixture to the flow rate of the oxygen plus the flow rate of chlorine is in a range from about 82% to about 95%, such as about 94%. By using such a ratio of oxygen and chlorine while etching the first metal layer, a high etch selectivity of the first metal layer to the first etch stop layer (e.g., a titanium nitride layer) and a high etch selectivity of the first metal layer to the mask layer (e.g., an oxide layer) can be achieved by the etch process.

In some examples, the first metal layer (e.g., a ruthenium layer) is etched for a duration based on an end point determination. An end point can be determined after initiation of the flowing of the gas(es) used to etch the first metal layer, and the etch process can continue for an over-etch period after the determination of the end point. The over-etch period can be some percentage of the time from the initiation of the flowing of the gas(es) to the determination of the end point. In some examples, the over-etch period is in a range from 10% to 100% (e.g., from greater than 20% to less than or equal to 60%) of the duration from the initiation of the flowing of the gas(es) to the determination of the end point. By using such an over-etch period, oxidation of the underlying first etch stop layer (e.g., a titanium nitride layer) can be minimized or reduced, while obtaining a desired profile of the etched first metal layer.

Various aspects of different examples are described below. Although multiples aspects of different examples may be described together in a process flow, the multiple aspects can each be implemented separately or individually and/or in a different process flow. Additionally, various process flows are described as being performed in an order; other examples can implement process flows in different orders and/or with more or fewer operations.

Figure 1:
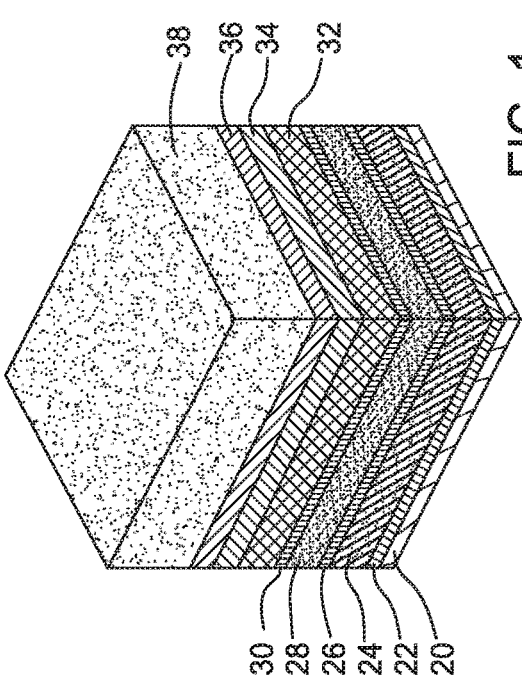

FIGS. 1 through 13 are perspective views depicting a process of forming a metal interconnect using a dual subtractive etch process according to some embodiments of the present disclosure. FIG. 1 illustrates the formation of layers on a substrate 20. The substrate 20 can include a semiconductor substrate, such as a bulk silicon wafer, a semiconductor-on-insulator (SOI) wafer, or the like. Various devices, such as fin field effect transistors (FinFETs) or the like, can be formed in and/or on the semiconductor substrate. The substrate 20 can include any number of layers and/or components on the semiconductor substrate. For example, any number of interlayer dielectrics (ILDs) and/or intermetallization dielectrics (IMDs) can be formed on the semiconductor substrate.

A first etch stop layer 22 is deposited on the substrate 20. An etch stop layer generally provides etch selectivity between adjacent layers and materials, such as by being or including a material different from the adjacent layers and materials. The first etch stop layer 22, in some examples, is titanium nitride (TiN) or another nitride material. A first metal layer 24 is deposited on the first etch stop layer 22. In some examples, the first metal layer 24 is or includes ruthenium (Ru) or another metal. A second etch stop layer 26 is deposited on the first metal layer 24. In some examples, the second etch stop layer 26 is titanium nitride (TiN) or another nitride material. A second metal layer 28 is deposited on the second etch stop layer 26. In some examples, the second metal layer 28 is or includes ruthenium (Ru) or another metal. A third etch stop layer 30 is deposited on the second metal layer 28. In some examples, the second etch stop layer 26 is titanium nitride (TiN) or another nitride material. A mask layer 32 is deposited on the third etch stop layer 30. In some examples, the mask layer 32 is or includes an oxide, such as silicon oxide formed using tetraethoxysilane (TEOS), or another material. The first etch stop layer 22, first metal layer 24, second etch stop layer 26, second metal layer 28, third etch stop layer 30, and mask layer 32 can be deposited by any acceptable deposition process, such as chemical vapor deposition (CVD), physical vapor deposition (PVD), or the like.

A first tri-layer mask is formed over the mask layer 32. The first tri-layer mask includes a first hardmask layer 34, a first anti-reflection coating (ARC) 36, and a first photoresist 38. The first hardmask layer 34 is deposited on the mask layer 32. In some examples, the first hardmask layer 34 is a carbon-containing material, such as a spin-on carbon (SOC), or the like. The first ARC 36 is deposited on the first hardmask layer 34. In some examples, the first ARC 36 is a silicon-containing ARC or another material. The first photoresist 38 is deposited on the first ARC 36. The first hardmask layer 34, first ARC 36, and first photoresist 38 can be deposited by any acceptable deposition process, such as a spin-on technique, CVD, or the like.

FIG. 2 illustrates the patterning of the first photoresist 38 into line patterns 38a, 38b, 38c, and 38d. The first photoresist 38 can be patterned using any acceptable lithography technique. As will become apparent, the line patterns 38a-d correspond to metal lines that will be formed in the first metal layer 24.

Figure 3:
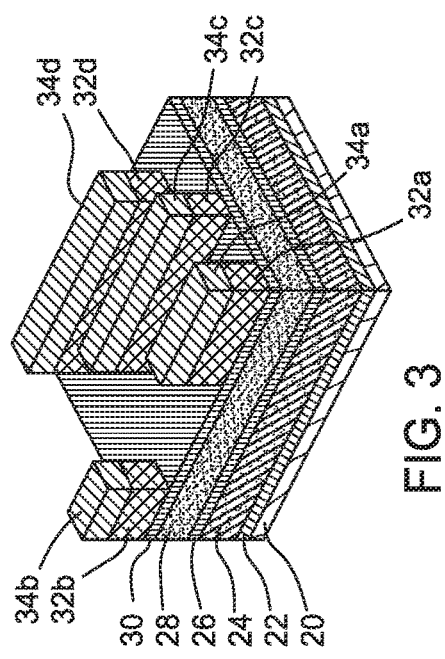

FIG. 3 illustrates transferring the pattern of the line patterns 38a, 38b, 38c, and 38d to the first hardmask layer 34 (to form line patterns 34a, 34b, 34c, and 34d, respectively) and the mask layer 32 (to form line patterns 32a, 32b, 32c, and 32d, respectively). Using the line patterns 38a-d of the first photoresist 38 as a mask, the first ARC 36 is etched. The etch process to etch the first ARC 36 can be a dry plasma etch, such as by an inductively coupled plasma (ICP) reactive ion etch (RIE) or another etch process. An example tool for performing the etch process is described below. In some examples using an ICP-RIE, the first ARC 36 can be etched using a gas mixture comprising fluoroform ($CHF_3$), tetrafluoromethane ($CF_4$), and oxygen ($O_2$). In such examples, a flow rate of fluoroform ($CHF_3$) can be in a range from about 75 standard cubic centimeter per minute (sccm) to about 150 sccm, such as about 100 sccm; a flow rate of tetrafluoromethane ($CF_4$) can be in a range from about 100 sccm to about 200 sccm, such as about 150 sccm; and a flow rate of oxygen ($O_2$) can be in a range from about 5 sccm to about 25 sccm, such as about 10 sccm. A pressure during the etch process can be in a range from about 2 mTorr to about 8 mTorr, such as about 4 mTorr. A power of the power supply for the antenna of the ICP-RIE can be in a range from about 300 W to about 700 W, such as about 500 W. A power of the substrate bias of the ICP-RIE can be in a range from about 60 W to about 100 W, such as about 80 W.

The first hardmask layer 34 is then etched to form the line patterns 34a, 34b, 34c, and 34d that correspond to the line patterns 38a, 38b, 38c, and 38d, respectively, of the first photoresist 38. Like with etching the first ARC 36, the etch process to etch the first hardmask layer 34 can be a dry plasma etch, such as by an ICP-RIE (for which an example tool is described below) or another etch process. In some examples using an ICP-RIE, the first hardmask layer 34 can be etched using a gas mixture comprising chlorine ($Cl_2$), hydrogen bromide (HBr), oxygen ($O_2$), and nitrogen ($N_2$). In such examples, a flow rate of chlorine ($Cl_2$) can be in a range from about 15 sccm to about 35 sccm, such as about 23 sccm; a flow rate of hydrogen bromide (HBr) can be in a range from about 200 sccm to about 600 sccm, such as about 400 sccm; a flow rate of oxygen ($O_2$) can be in a range from about 30 sccm to about 70 sccm, such as about 50 sccm; and a flow rate of nitrogen ($N_2$) can be in a range from about 100 sccm to about 200 sccm, such as about 150 sccm. A pressure during the etch process can be in a range from about 5 mTorr to about 15 mTorr, such as about 10 mTorr. A power of the power supply for the antenna of the ICP-RIE can be in a range from about 600 W to about 1000 W, such as about 800 W. A power of the substrate bias of the ICP-RIE can be in a range from about 100 W to about 150 W, such as about 125 W.

The mask layer 32 is then etched to form the line patterns 32a, 32b, 32c, and 32d that correspond to the line patterns 38a, 38b, 38c, and 38d, respectively, of the first photoresist 38. Like with etching the first ARC 36, the etch process to etch the mask layer 32 can be a dry plasma etch, such as by an ICP-RIE (for which an example tool is described below) or another etch process. In some examples using an ICP-RIE, the mask layer 32 can be etched using a gas mixture comprising fluoroform ($CHF_3$) and tetrafluoromethane ($CF_4$). In such examples, a flow rate of fluoroform ($CHF_3$) can be in a range from about 75 sccm to about 125 sccm, such as about 100 sccm, and a flow rate of tetrafluoromethane ($CF_4$) can be in a range from about 75 sccm to about 125 sccm, such as about 100 sccm. A pressure during the etch process can be in a range from about 4 mTorr to about 8 mTorr, such as about 6 mTorr. A power of the power supply for the antenna of the ICP-RIE can be in a range from about 400 W to about 600 W, such as about 500 W. A power of the substrate bias of the ICP-RIE can be in a range from about 60 W to about 100 W, such as about 80 W.

During the etching of the first ARC 36, the first hardmask layer 34, and/or the mask layer 32, the first photoresist 38 (e.g., line patterns 38a-d) and the first ARC 36 may be consumed.

Figure 4:
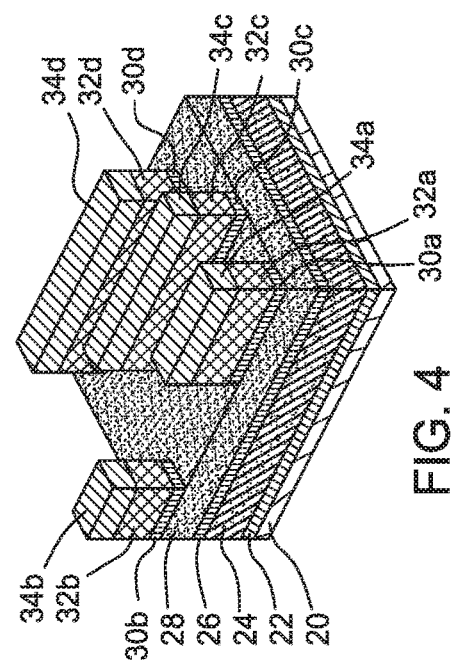

FIG. 4 illustrates transferring the pattern of the line patterns 32a, 32b, 32c, and 32d to the third etch stop layer 30 (to form line patterns 30a, 30b, 30c, and 30d, respectively). The third etch stop layer 30 is etched to form the line patterns 30a, 30b, 30c, and 30d that correspond to the line patterns 38a, 38b, 38c, and 38d, respectively, of the first photoresist 38. Like with etching the first ARC 36, the etch process to etch the third etch stop layer 30 can be a dry plasma etch, such as by an ICP-RIE (for which an example tool is described below) or another etch process. In some examples using an ICP-RIE, the third etch stop layer 30 can be etched using a gas mixture comprising chlorine ($Cl_2$), methane ($CH_4$), and argon (Ar). In such examples, a flow rate of chlorine ($Cl_2$) can be in a range from about 50 sccm to about 150 sccm, such as about 50 sccm; a flow rate of methane ($CH_4$) can be in a range from about 10 sccm to about 30 sccm, such as about 15 sccm; and a flow rate of argon (Ar) can be in a range from about 10 sccm to about 200 sccm, such as about 100 sccm. A pressure during the etch process can be in a range from about 4 mTorr to about 10 mTorr, such as about 8 mTorr. A power of the power supply for the antenna of the ICP-RIE can be in a range from about 400 W to about 800 W, such as about 600 W. A power of the substrate bias of the ICP-RIE can be in a range from about 30 W to about 60 W, such as about 45 W.

Figure 5:
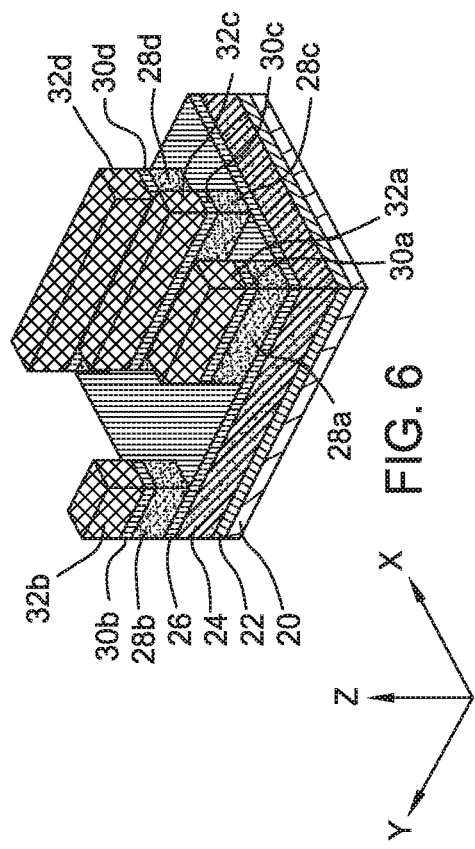

FIG. 5 illustrates the removal of the line patterns 34a-d of the first hardmask layer 34. The line patterns 34a-d are removed by an ash process, such as using an oxygen plasma. As illustrated by FIG. 5, the ash process is performed after the etching of the third etch stop layer 30 in FIG. 4. In some examples, the ash process can use a gas mixture comprising oxygen ($O_2$) and nitrogen ($N_2$). In such examples, a flow rate of oxygen ($O_2$) can be in a range from about 50 sccm to about 150 sccm, such as about 100 sccm, and a flow rate of nitrogen ($N_2$) can be in a range from about 10 sccm to about 40 sccm, such as about 20 sccm. A pressure during the ash process can be in a range from about 8 mTorr to about 12 mTorr, such as about 10 mTorr. A power of the power supply for the antenna of the ash process can be in a range from about 800 W to about 1200 W, such as about 1000 W. A power of the substrate bias of the ICP-RIE can be less than about 40 W, such as not biased.

In some scenarios, performing an oxygen ash process after etching the third etch stop layer 30 can enable proper transfer of the pattern of the line patterns 32a, 32b, 32c, and 32d to the third etch stop layer 30. Some examples contemplate that the third etch stop layer 30 is titanium nitride (TiN). The upper portion of the titanium nitride can be exposed to a fluorine-containing species (e.g., fluoroform ($CHF_3$) and/or tetrafluoromethane ($CF_4$)) during the etch process that patterns the mask layer 32. By being exposed to the fluorine-containing species, the upper portion of the titanium nitride can react with fluorine and form titanium fluoride ($TiF_x$) at the upper portion. If the oxygen ash process is performed before the etching of the third etch stop layer 30, the titanium fluoride can react with oxygen radicals of the ash process to form titanium oxyfluoride (TiOF) at the upper surface of the third etch stop layer 30. If titanium oxyfluoride (TiOF) is on the upper surface of the third etch stop layer 30, the etch process to etch the third etch stop layer 30 (which implements a gas mixture comprising chlorine ($Cl_2$), methane ($CH_4$), and argon (Ar)) may not react appropriately with the titanium oxyfluoride (TiOF), and hence, the third etch stop layer 30 may not be appropriately etched. If, on the other hand, the third etch stop layer 30 is etched before the oxygen ash process, the titanium oxyfluoride (TiOF) is not formed on the upper surface of the third etch stop layer 30 as a result of the oxygen ash process before the etching of the third etch stop layer 30, and hence, the third etch stop layer 30 may be appropriately etched. Other examples can implement other materials and/or etch chemistries, for example, such that other orders of processing may be implemented (e.g., performing the ash process before etching the third etch stop layer 30).

Figure 6:
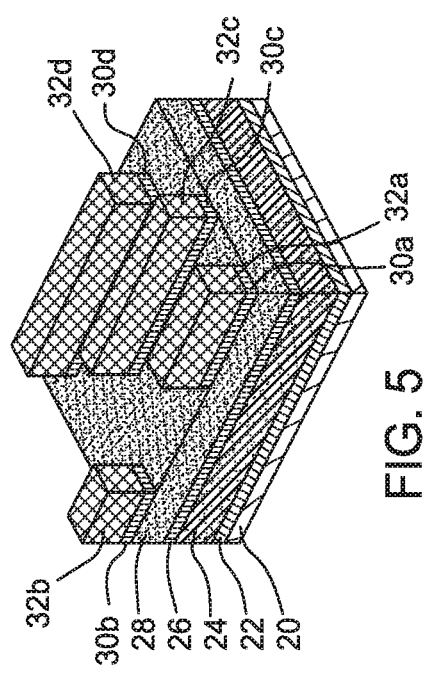

FIG. 6 illustrates transferring the pattern of the line patterns 32a, 32b, 32c, and 32d to the second metal layer 28 (to form line patterns 28a, 28b, 28c, and 28d, respectively). The second metal layer 28 is etched to form the line patterns 28a, 28b, 28c, and 28d that correspond to the line patterns 38a, 38b, 38c, and 38d, respectively, of the first photoresist 38. Like with etching the first ARC 36, the etch process to etch the second metal layer 28 can be a dry plasma etch, such as by an ICP-RIE (for which an example tool is described below) or another etch process. In some examples using an ICP-RIE, the second metal layer 28 can be etched using a gas mixture comprising oxygen ($O_2$) and chlorine ($Cl_2$). In such examples, a flow rate of oxygen ($O_2$) can be in a range from about 300 sccm to about 500 sccm, such as about 400 sccm, and a flow rate of chlorine ($Cl_2$) can be in a range from about 10 sccm to about 50 sccm, such as about 25 sccm. A pressure during the etch process can be in a range from about 20 mTorr to about 40 mTorr, such as about 30 mTorr. A power of the power supply for the antenna of the ICP-RIE can be in a range from about 800 W to about 1200 W, such as about 1000 W. A power of the substrate bias of the ICP-RIE can be in a range from about 40 W to about 70 W, such as about 50 W.

Figure 14:
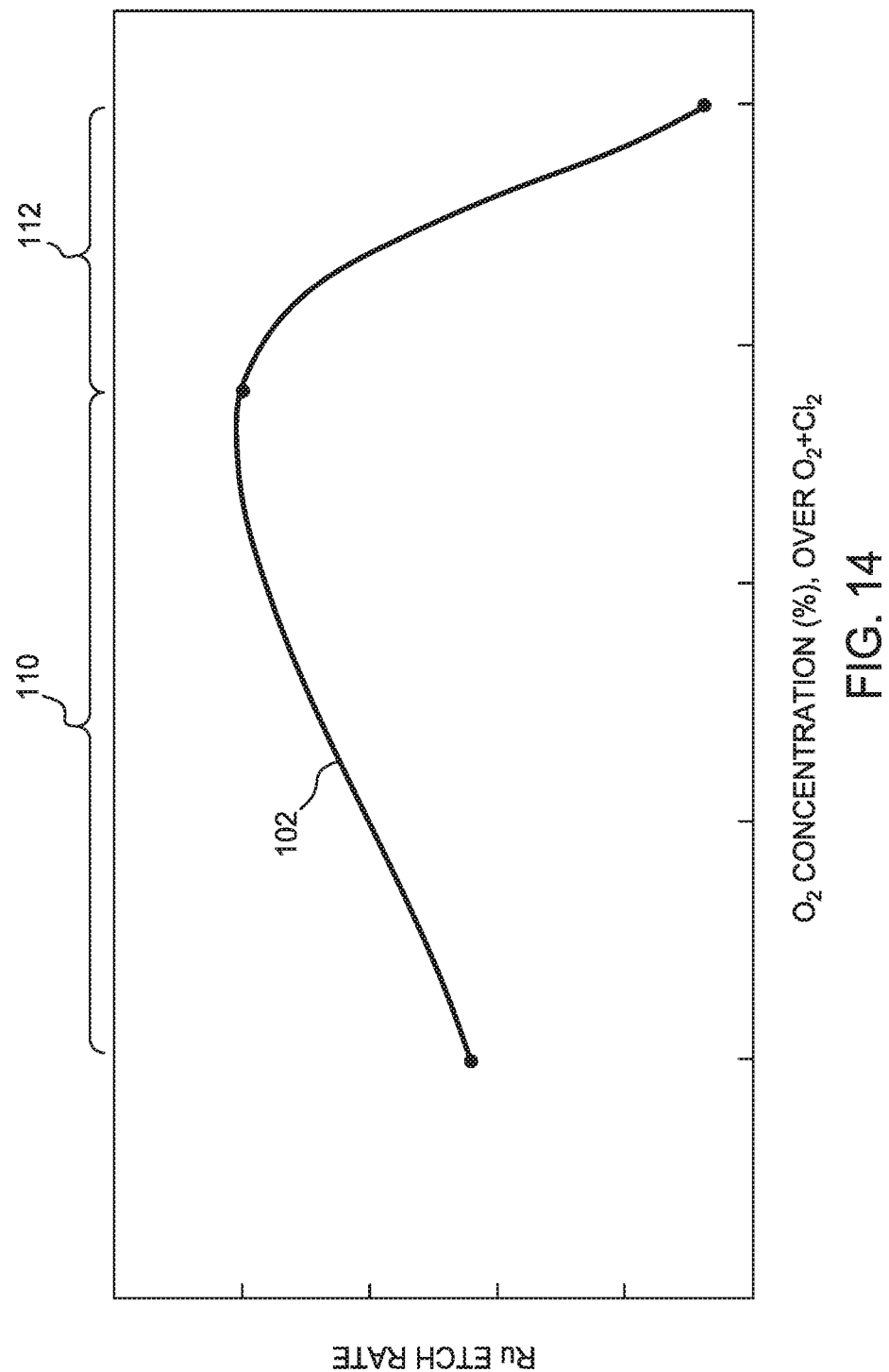
FIG. 14 is a graph of an etch rate of ruthenium as a function of oxygen ($O_2$) concentration according to some embodiments of the present disclosure.
Figure 15:
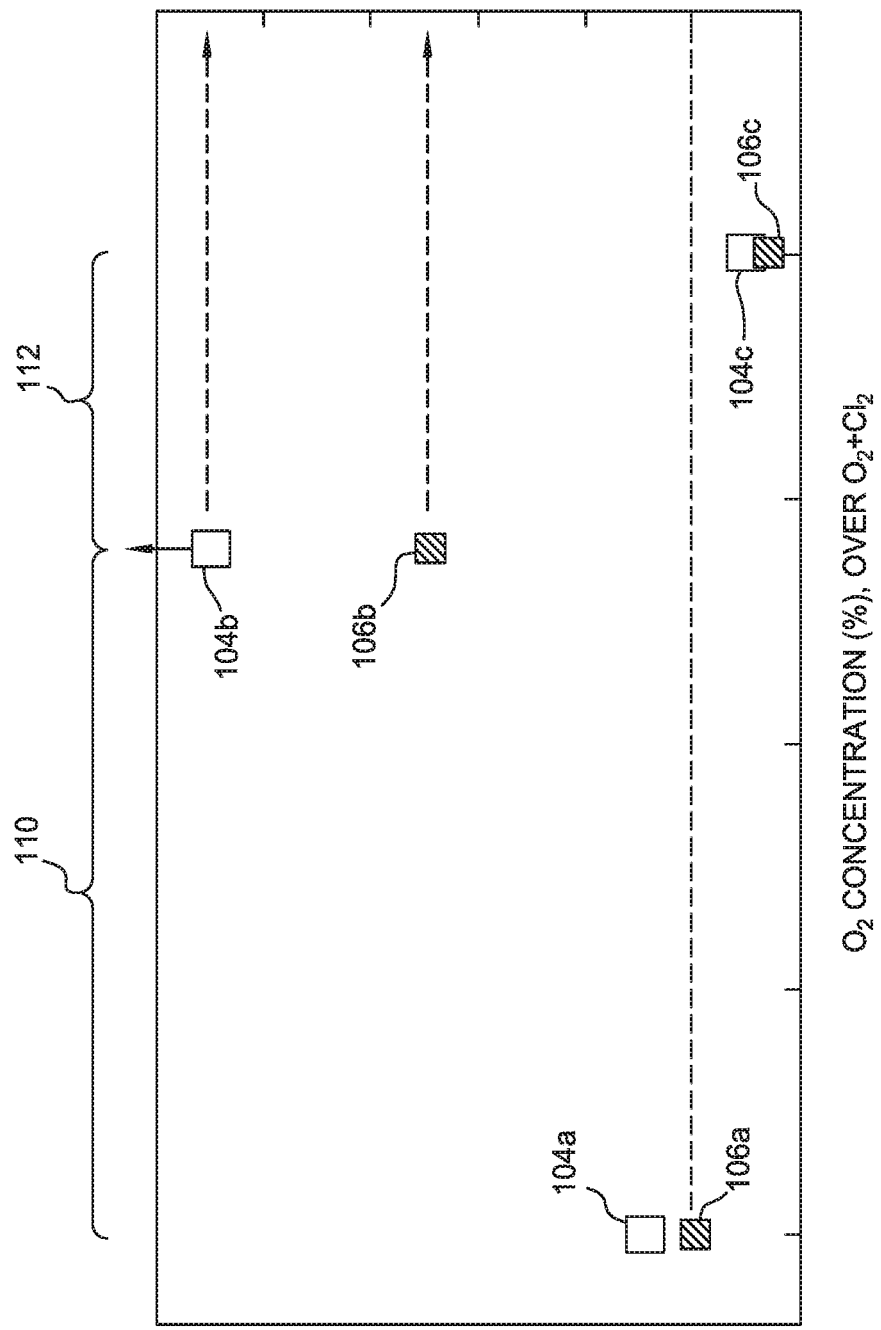
FIG. 15 is a graph of etch selectivities of ruthenium to titanium nitride and oxide as a function of oxygen ($O_2$) concentration according to some embodiments of the present disclosure.

Some examples contemplate that the mask layer 32 is an oxide, that the second metal layer 28 is ruthenium (Ru), and that the second etch stop layer 26 is titanium nitride (TiN). In these examples, an ICP-RIE is implemented to etch the second metal layer 28, and the ICP-RIE uses a gas mixture comprising oxygen ($O_2$) and chlorine ($Cl_2$). FIG. 14 illustrates the etch rate 102 of ruthenium as a function of concentration of oxygen ($O_2$) in a gas mixture of oxygen ($O_2$) and chlorine ($Cl_2$). FIG. 15 is a plot of etch selectivities as a function of concentration of oxygen ($O_2$) in a gas mixture of oxygen ($O_2$) and chlorine ($Cl_2$). FIG. 15 shows data points 104a, 104b, and 104c that show the etch selectivity of ruthenium to titanium nitride at differing concentrations of oxygen, and shows data points 106a, 106b, and 106c that show the etch selectivity of ruthenium to oxide at differing concentrations of oxygen. FIGS. 14 and 15 further show a first regime 110 and a second regime 112. In the first regime 110, the dominant etch byproduct is $RuO_xCl$, where x is in a range from 2 to 3. In the second regime 112, the dominant etch byproduct is $RuO_4$, and ion bombardment is dominant at processing temperatures below 150° C.

As illustrated in FIG. 14, the etch rate 102 has a peak of about 200 angstroms/minute near the boundary between the first regime 110 and the second regime 112 (e.g., at approximately 94% oxygen). As illustrated in FIG. 15, the etch selectivity of ruthenium to titanium nitride and the etch selectivity of ruthenium to oxide are both high at the boundary between the first regime 110 and the second regime 112 (e.g., at approximately 94% oxygen) as shown by the data points 104b and 106b. The etch selectivity of ruthenium to titanium nitride is greater than 50 as shown by data point 104b at the boundary, and the etch selectivity of ruthenium to oxide is greater than 30 as shown by data point 106b. Data points 104a and 106a show the etch selectivities of ruthenium to titanium nitride and ruthenium to oxide at 80% oxygen, and data points 104c and 106c show the etch selectivities of ruthenium to titanium nitride and ruthenium to oxide at 100% oxygen.

Hence, in some examples, a concentration of oxygen ($O_2$) in a gas mixture of oxygen ($O_2$) and chlorine ($Cl_2$) in an etch process to etch the second metal layer 28 of ruthenium is in a range from about 82% to about 95%. In such a range, a high etch rate of ruthenium can be achieved, as well as high etch selectivities of ruthenium to titanium nitride and ruthenium to oxide.

Figure 16:
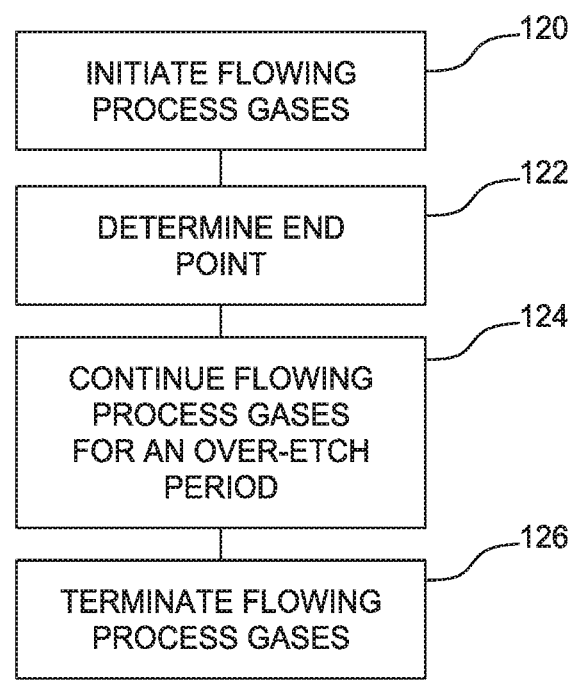
FIG. 16 is a flowchart of a method for an etch process according to some embodiments of the present disclosure.
Figure 17:
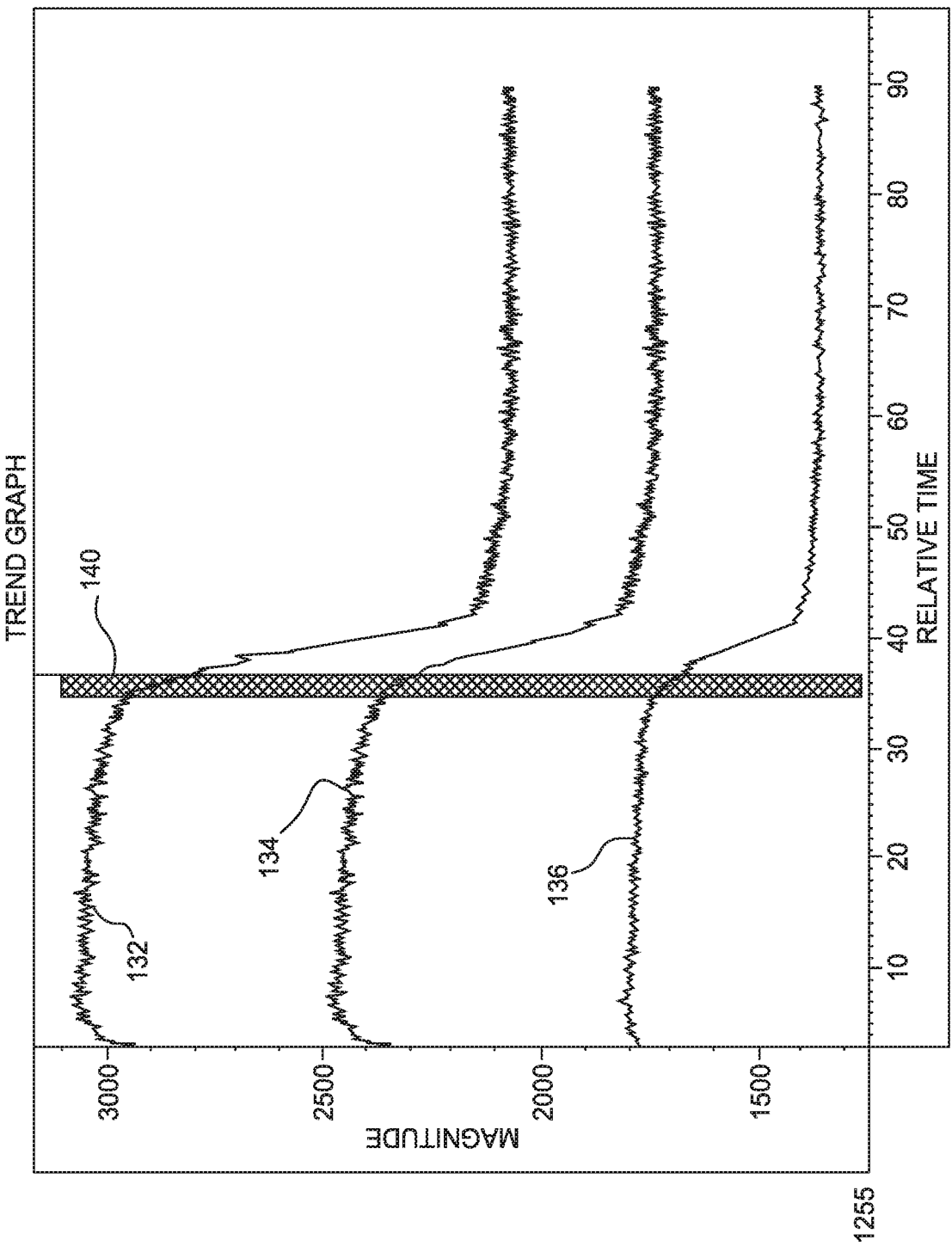
FIG. 17 is a graph of detected signals using optical emission spectrometry (OES) during etching of ruthenium on a patterned wafer according to some embodiments of the present disclosure.

In some examples, an end point for the etch process is detected, and the etch process continues for an over-etch period. The etch process is illustrated in FIG. 16. In operation 120, flowing of process gases for the etch process is initiated. The etch process can implement the mixture of oxygen ($O_2$) and chlorine ($Cl_2$) as described above. In operation 122, an end point is determined. The end point is determined, in some examples, using optical emission spectrometry (OES). OES can be used to determine the presence of a given material on the substrate 20. For example, light can be reflected by the material on the substrate 20 and/or by gases in the chamber that implements the etch process. A relatively high magnitude of reflected light can indicate the presence of the material, while a relatively low magnitude of reflected light can indicate the absence of the material, in some examples. Generally, when a detected signal (e.g., magnitude of detected reflected light) using OES decreases by some predetermined amount, then the end point is detected. FIG. 17 is a graph of detected signals using OES during etching of ruthenium on a patterned wafer, according to an example. The graph shows the detected signals as a magnitude as a function of relative time. A first detected signal 132 is the magnitude of light having a wavelength of 656 nm that is detected. A second detected signal 134 is the magnitude of light having a wavelength of 415 nm that is detected. A third detected signal 136 is the magnitude of light having a wavelength of 365 nm that is detected. An end point 140 is determined from the detected signals 132, 134, and 136. In some examples, the end point 140 is a time when any of the detected signals 132, 134, and 136 decreases by at least 1% from the immediately preceding sampling step for 5 consecutive sampling steps, where the sampling steps are sampled at a frequency of 60 Hz. In other examples, the end point 140 can be determined by any decrease, such as by any change of magnitude over change in time, any percentage decrease for any number of sampling steps, or the like, of any or all of the detected signals.

Referring back to FIG. 16, in operation 124, flowing of the process gases for the etch process continues for an over-etch period. The over-etch period, in some examples, is some predetermined duration that is a percentage (which may be over 100%) of the duration from the time that the flowing of process gases is initiated in operation 120 to the time that the end point is determined in operation 122. At the conclusion of the over-etch period, in operation 126, flowing of process gases for the etch process is terminated. A chamber purge by an inert gas may follow the termination of the flowing of the process gases for the etch process.

In some examples, the etch process continues for an over-etch period that does not exceed 100% (such as does not exceed 60%) of the duration of the etch process up to the end point. If the etch process continues in excess of 100% of the duration of the etch process up to the end point, the underlying second etch stop layer 26 of titanium nitride can be oxidized by the oxygen of the etch process. If the titanium nitride is oxidized, a subsequent etch to etch through the second etch stop layer 26 may not appropriately etch the second etch stop layer 26 to transfer a pattern. However, if the over-etch period does not exceed 100% (such as does not exceed 60%) of the duration of the etch process up to the end point, oxidation of the titanium nitride of the second etch stop layer 26 may be minimized or remain insufficient to adversely affect the etching of the second etch stop layer 26.

Further, in some examples, the etch process continues for an over-etch period that is at least 10% (such as at least 20%) of the duration of the etch process up to the end point. The duration of the over-etch period can be tuned to achieve a profile of the line patterns 28a, 28b, 28c, and 28d. If the over-etch period is less than 10% of the duration of the etch process up to the end point, the sidewalls of the line patterns 28a-d can be sloped (e.g., the line patterns 28a-d can have a tapered profile). This, in conjunction with a subsequent etch process that etches the first metal layer 24 (which further etches patterns of the second metal layer 28 to form more vertical sidewalls), can result in shoulders that are formed on the subsequently etched second etch stop layer 26. If the over-etch period is at least 10% (such as at least 20%) of the duration of the etch process up to the end point, sidewalls of the line patterns 28a-d can be substantially vertical (e.g., within 5° of vertical, or more specifically, within 3° of vertical). This can result in sidewalls of subsequently etched layers being more aligned. Additional details of these aspects will be described subsequently with respect to FIGS. 19 through 22.

Figure 7:
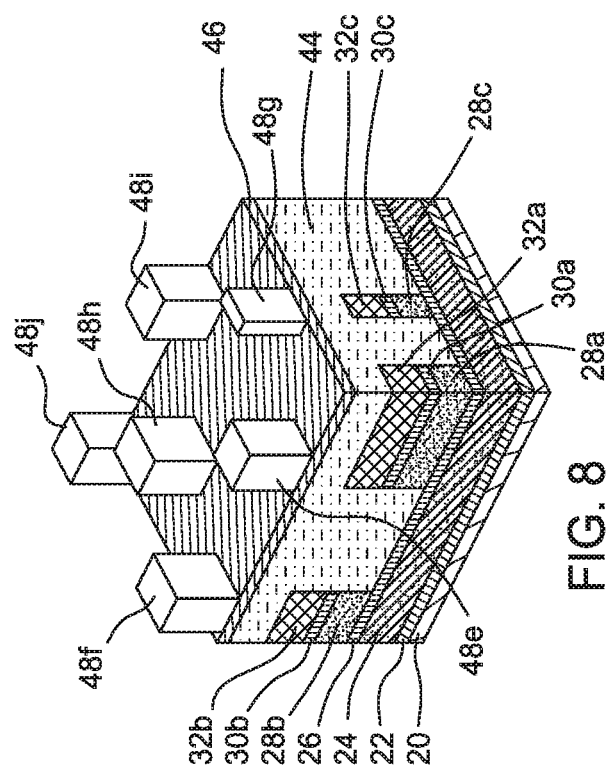

FIG. 7 illustrates the formation of a second tri-layer mask over the line patterns 32a-d, 30a-d, 28a-d, and second etch stop layer 26. The second tri-layer mask includes a second hardmask layer 44, a second ARC 46, and a second photoresist 48. The second hardmask layer 44 is deposited on the line patterns 32a-d, 30a-d, 28a-d, and second etch stop layer 26. In some examples, the second hardmask layer 44 is a carbon-containing material, such as a SOC, or the like. The second ARC 46 is deposited on the second hardmask layer 44. In some examples, the second ARC 46 is a silicon-containing ARC or another material. The second photoresist 48 is deposited on the second ARC 46. The second hardmask layer 44, second ARC 46, and second photoresist 48 can be deposited by any acceptable deposition process, such as a spin-on technique, CVD, or the like.

Figure 8:
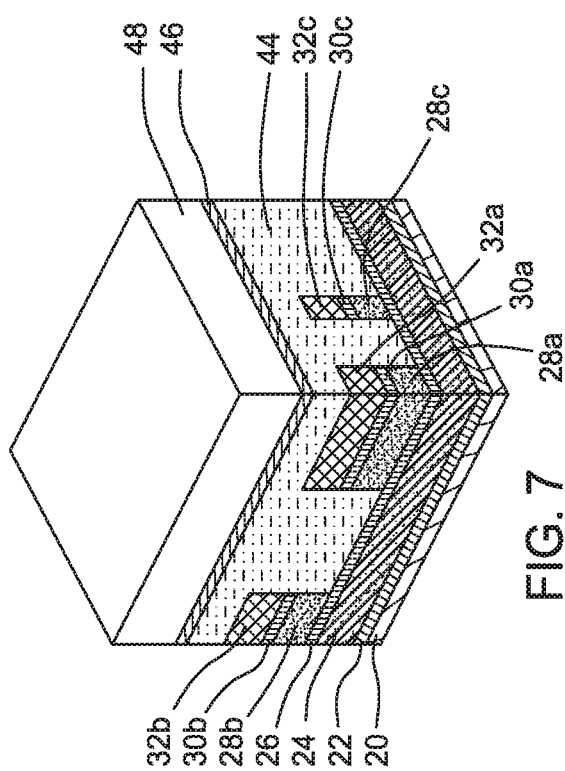
Figure 18:
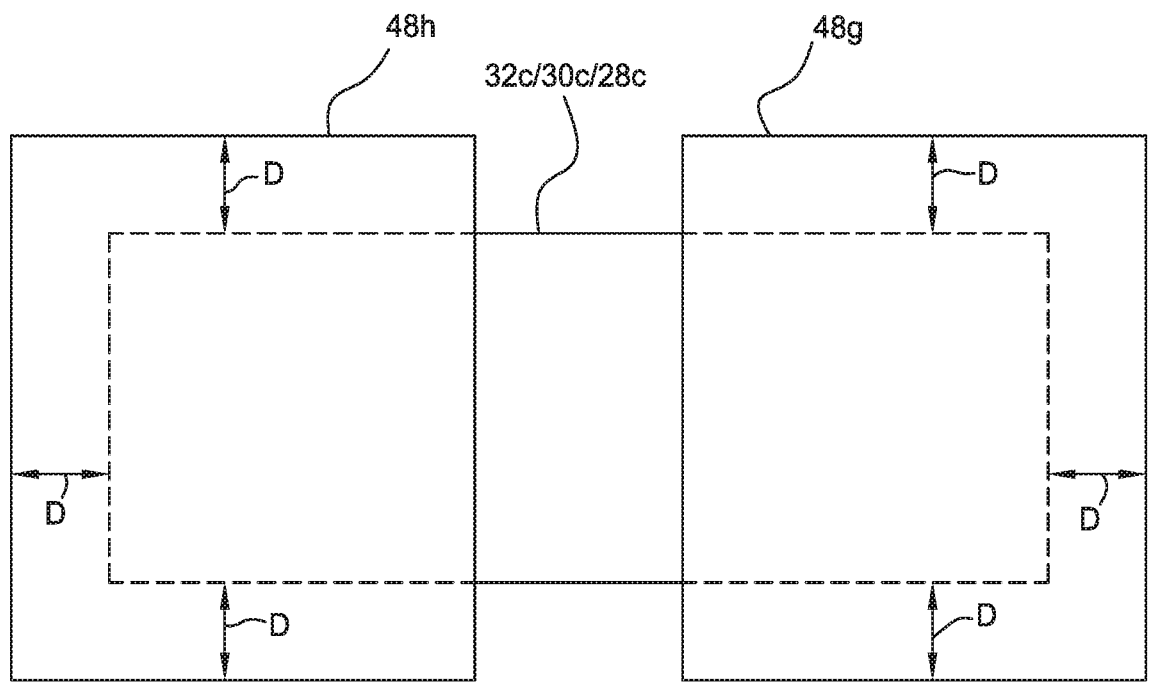
FIG. 18 is a layout of example via patterns and line patterns according to some embodiments of the present disclosure.

FIG. 8 illustrates the patterning of the second photoresist 48 into via patterns 48e, 48f, 48g, 48h, 48i, and 48j. The second photoresist 48 can be patterned using any acceptable lithography technique. As will become apparent, the via patterns 48e-j correspond to vias that will be formed in the second metal layer 28. The via patterns 48e-j are each vertically above at least a respective portion of the line patterns 28a-d, 30a-d, 32a-d. Further, each of the via patterns 48e-j extends laterally beyond the line patterns 28a-d, 30a-d, 32a-d. FIG. 18 illustrates an example layout of these features. As shown in FIG. 18, the via patterns 48h and 48g laterally extend beyond sidewalls of the line pattern 32c/30c/28c by a dimension D. By aligning the via patterns 48e-j in such a manner, the subsequently formed vias may be self-aligned to the subsequently formed metal lines.

FIG. 9 illustrates transferring the pattern of the via patterns 48e, 48f, 48g, 48h, 48i, and 48j to the second hardmask layer 44 (to form via patterns 44e, 44f, 44g, 44h, 44i, and 44j, respectively) and the line patterns 32a-d (to form via patterns 32e, 32f, 32g, 32h, 32i, and 32j, respectively). Using the via patterns 48e-j of the second photoresist 48 as a mask, the second ARC 46 is etched. The etch process to etch the second ARC 46 may be the same or similar to the etch process for etching the first ARC 36 in FIG. 3.

The second hardmask layer 44 is then etched to form the via patterns 44e, 44f, 44g, 44h, 44i, and 44j that correspond to the via patterns 48e, 48f, 48g, 48h, 48i, and 48j, respectively, of the second photoresist 48. The etch process to etch the second hard mask layer 44 may be the same or similar to the etch process for etching the first hardmask layer 34 in FIG. 3.

The line patterns 32a-d of the mask layer 32 are then etched to form the via patterns 32e, 32f, 32g, 32h, 32i, and 32j that correspond to the via patterns 48e, 48f, 48g, 48h, 48i, and 48j, respectively, of the second photoresist 48. The mask layer 32 may be etched using a same or similar process as described above with respect to FIG. 3 for previously etching the mask layer 32. As illustrated by FIG. 9, and as a result of the alignment illustrated by FIG. 18, the via patterns 44e-j may extend laterally from and be along sidewalls of the via patterns 32e-j and line patterns 30a-d and 28a-d.

During the etching of the second ARC 46, the second hardmask layer 44, and/or the mask layer 32, the second photoresist 48 (e.g., via patterns 48e-j) and the second ARC 46 may be consumed.

FIG. 10 illustrates the removal of the via patterns 44e-j of the second hardmask layer 44. The via patterns 44e-j are removed by an ash process, such as using an oxygen plasma. The ash process can be the same or similar to the ash process described above with respect to FIG. 5.

FIG. 11 illustrates transferring the pattern of the via patterns 32e, 32f, 32g, 32h, 32i, and 32j to the line patterns 30a-d of the third etch stop layer 30 (to form via patterns 30e, 30f, 30g, 30h, 30i, and 30j, respectively) and transferring the pattern of the line patterns 28a, 28b, 28c, and 28d to the second etch stop layer 26 (to form line patterns 26a, 26b, 26c, and 26d, respectively). The line patterns 30a-d of the third etch stop layer 30 are etched to form the via patterns 30e, 30f, 30g, 30h, 30i, and 30j that correspond to the via patterns 48e, 48f, 48g, 48h, 48i, and 48j, respectively, of the second photoresist 48. The second etch stop layer 26 is etched to form the line patterns 26a, 26b, 26c, and 26d that correspond to the line patterns 38a, 38b, 38c, and 38d, respectively, of the first photoresist 38. The third etch stop layer 30 and the second etch stop layer 26 are etched simultaneously to form the via patterns 30e-j and the line patterns 26a-d. The etch process to etch the third etch stop layer 30 and the second etch stop layer 26 can be the same or similar to the etch process described above with respect to FIG. 4 for etching the third etch stop layer 30.

FIG. 12 illustrates transferring the pattern of the via patterns 32e, 32f, 32g, 32h, 32i, and 32j to the line patterns 28a-d of the second metal layer 28 (to form vias 28e, 28f, 28g, 28h, 28i, and 28j, respectively) and transferring the pattern of the line patterns 28a, 28b, 28c, and 28d to the first metal layer 24 (to form metal lines 24a, 24b, 24c, and 24d, respectively). The line patterns 28a-d of the second metal layer 28 are etched to form the vias 28e, 28f, 28g, 28h, 28i, and 28j that correspond to the via patterns 48e, 48f, 48g, 48h, 48i, and 48j, respectively, of the second photoresist 48. The first metal layer 24 is etched to form the metal lines 24a, 24b, 24c, and 24d that correspond to the line patterns 38a, 38b, 38c, and 38d, respectively, of the first photoresist 38. The line patterns 28a-d of the second metal layer 28 and the first metal layer 24 are etched simultaneously to form the vias 28e-j and the metal lines 24a-d. The etch process to etch the second metal layer 28 and the first metal layer 24 can be the same or similar to the etch process described above with respect to FIG. 6 for etching the second metal layer 28.

FIGS. 19 through 22 illustrate different results of etch processes in accordance with some examples. These figures refer to features illustrated in and described with respect to FIGS. 1 through 12 for ease of reference to various processing steps. The etch processes described with respect to FIGS. 19 through 22 may or may not be implemented in the processing of FIGS. 1 through 12. FIGS. 19 and 21 illustrate cross-sectional views corresponding to processing described with respect to FIG. 6 above, and FIGS. 20 and 22 illustrate cross-sectional views corresponding to processing described with respect to FIG. 12 above. The cross-sectional views correspond to an X-Z plane as indicated by the X-YZ axes in FIGS. 6 and 12.

As stated with respect to FIG. 6 and in reference to FIG. 19, the etch process that etches the second metal layer 28 continues for an over-etch period that is less than 10% of the duration of the etch process up to the end point to form the line pattern 28a'. The resultant line pattern 28a' has sloped sidewalls that result in a tapered profile of the line pattern 28a'. When the pattern of the line pattern 28a' is then transferred to the second etch stop layer 26 (e.g., in FIG. 11), the bottom of the line pattern 28a' defines the lateral edges of the line pattern 26a' of the second etch stop layer 26. The subsequent etch process (e.g., in FIG. 12) that transfers the line pattern 26a' to the first metal layer 24 to form the metal line 24a' also etches the line pattern 28a' to form the via 28e'. The portion of the line pattern 28a' that remains as the via 28e' is further etched to cause the sidewalls of the via 28e' to become more vertical. The line pattern 26a' is not significantly etched, which causes shoulders 150 to be formed, as illustrated in FIG. 20.

As stated with respect to FIG. 6 and in reference to FIG. 21, the etch process that etches the second metal layer 28 continues for an over-etch period that exceeds 10% (e.g., exceeds 20%), but less than 100% (e.g. less than or equal to 60%), of the duration of the etch process up to the end point to form the line pattern 28a". For example, the over-etch period can be 50% of the duration of the etch process up to the end point to form the line pattern 28a". The resultant line pattern 28a" has vertical sidewalls. When the pattern of the line pattern 28a" is then transferred to the second etch stop layer 26 (e.g., in FIG. 11), the bottom of the line pattern 28a" defines the lateral edges of the line pattern 26a" of the second etch stop layer 26. The subsequent etch process (e.g., in FIG. 12) that transfers the line pattern 26a" to the first metal layer 24 to form the metal line 24a" also etches the line pattern 28a" to form the via 28e". Since the sidewalls of the line pattern 28a" were vertical, the portion of the line pattern 28a" that remains as the via 28e" may not be etched to cause the sidewalls of the via 28e" to become more vertical (although undercutting may occur). This can cause the sidewalls of the metal line 24a", line pattern 26a", and via 28e" to be vertically aligned, as illustrated in FIG. 22.

FIG. 13 illustrates the etching of the first etch stop layer 22 and formation of a dielectric layer 50. The etch process for etching the first etch stop layer 22 can be a dry plasma etch, such as by an ICP-RIE or another etch process. The dielectric layer 50 can be or include silicon oxide (e.g., doped or undoped), a low-k dielectric, silicon oxycarbide, the like, or a combination thereof. The dielectric layer 50 can be deposited by CVD (e.g., plasma enhanced CVD (PECVD), flowable CVD (FCVD), or the like), spin-on, or any other deposition process. After being deposited, the dielectric layer 50 can be planarized, such as by a chemical mechanical planarization (CMP), which may also remove the via patterns 32e-j and 30e-j.

Figure 23:
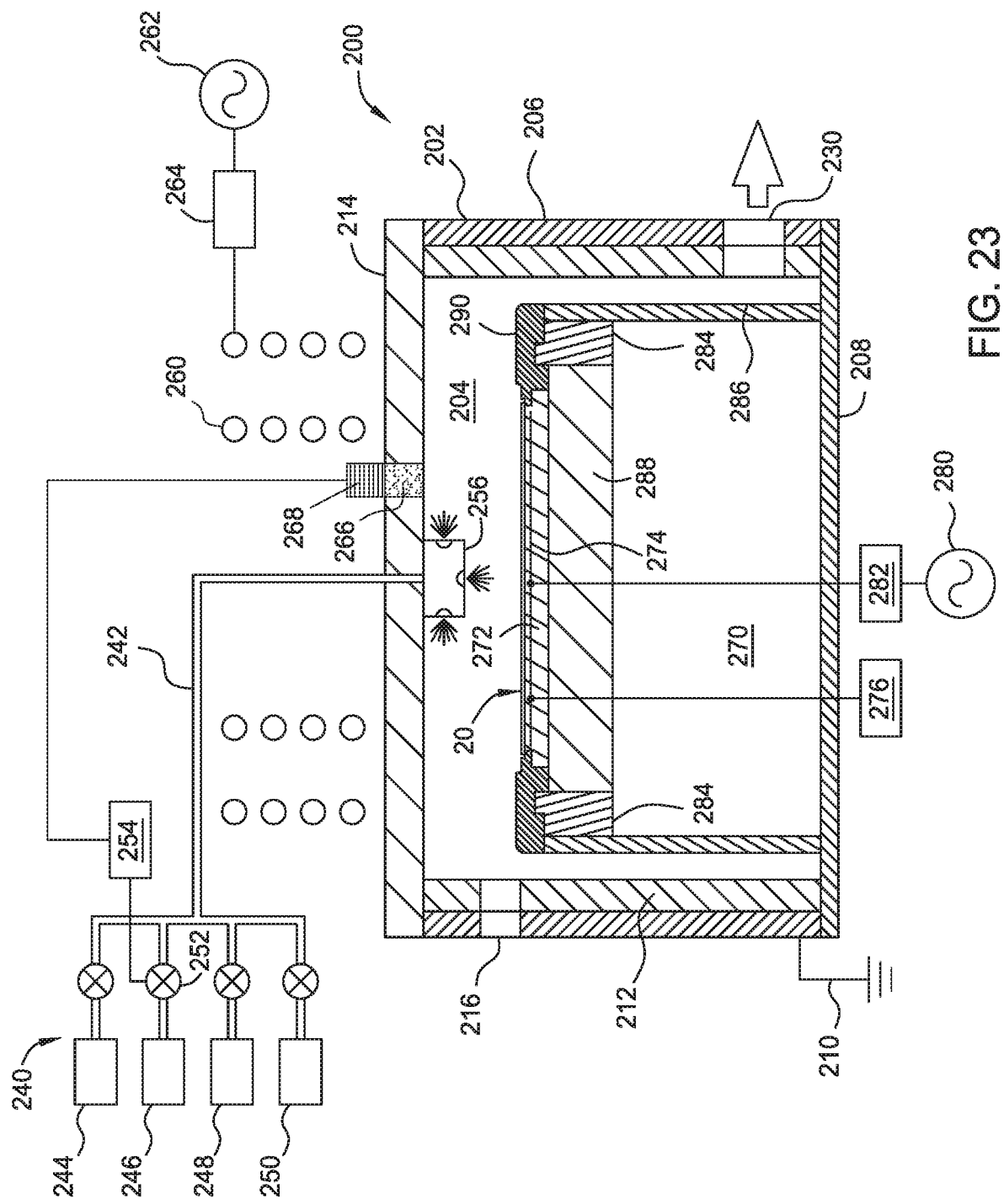
FIG. 23 is a simplified schematic view of an example etch processing chamber according to some embodiments of the present disclosure.

FIG. 23 is a simplified schematic view of an example etching processing chamber 200 for etch processes described above. The etching processing chamber 200 is suitable for etching one or more layers on the substrate 20. An example of the processing chamber that may be adapted to benefit from the disclosure is an AdvantEdge Mesa Etch processing chamber, available from Applied Materials, Inc., located in Santa Clara, Calif. It is contemplated that other processing chambers, including those from other manufactures, may be adapted to practice various embodiments of the disclosure.

The etching processing chamber 200 includes a chamber body 202 having a chamber volume 204 defined therein. The chamber body 202 has sidewalls 206 and a bottom 208 which are coupled to a ground node 210. The sidewalls 206 have a protective inner liner 212 to extend the time between maintenance cycles of the etching processing chamber 200.

The dimensions of the chamber body 202 and related components of the etching processing chamber 200 are not limited and generally are proportionally larger than the size of the substrate (e.g., substrate 20) to be processed therein. Examples of substrate sizes include 200 mm diameter, 350 mm diameter, 400 mm diameter, and 450 mm diameter, among others.

Figure 24:
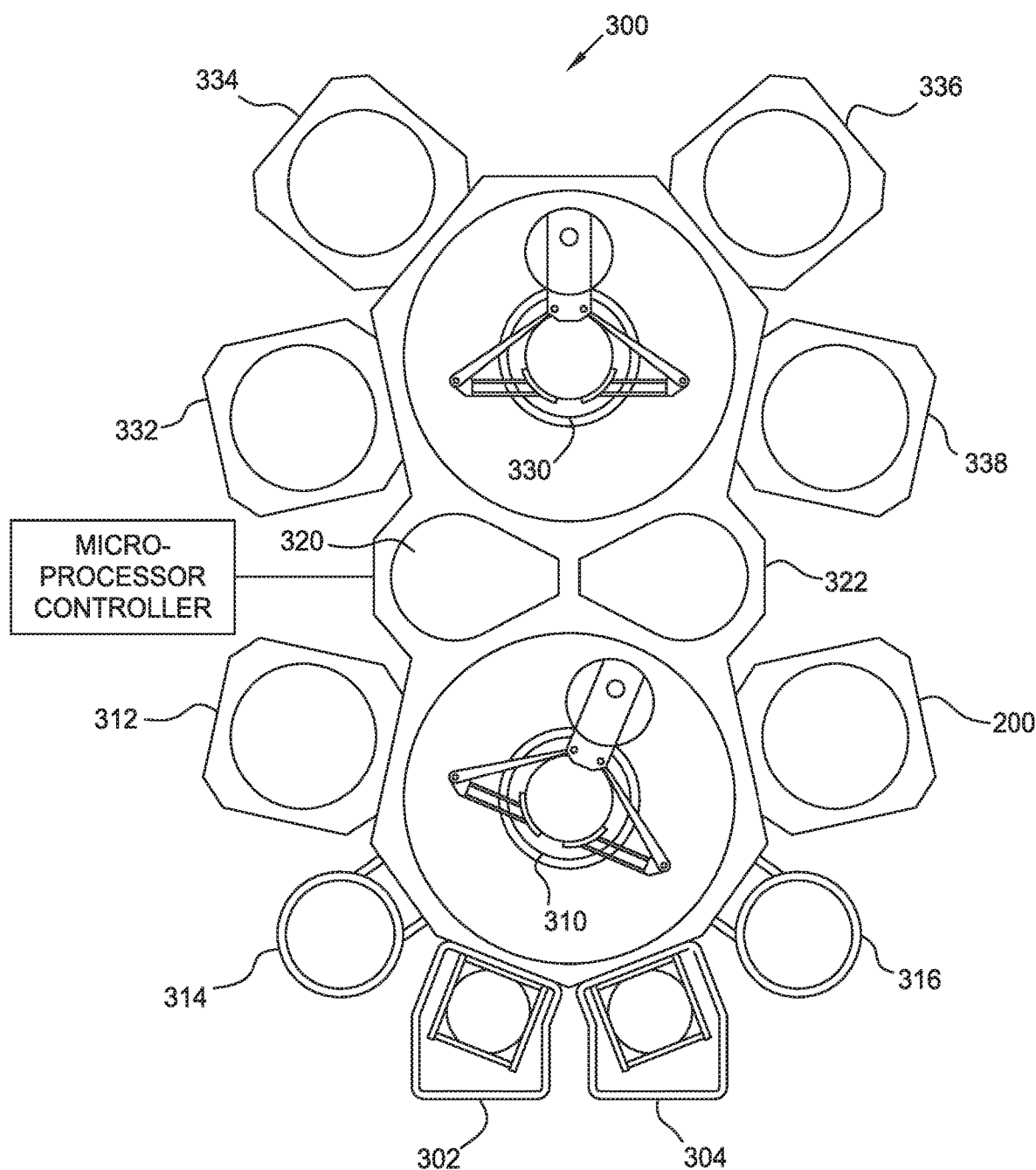
FIG. 24 is a schematic top-view diagram of an example multi-chamber processing system according to some embodiments of the present disclosure.

The chamber body 202 supports a chamber lid assembly 214 to enclose the chamber volume 204. The chamber body 202 may be fabricated from aluminum or other suitable materials. A substrate access port 216 is formed through the sidewalls 206 of the chamber body 202, facilitating the transfer of substrates into and out of the etching processing chamber 200. The substrate access port 216 may be coupled to a transfer chamber and/or other chambers of a multi-chamber processing system (an example of which is shown in FIG. 24).

A pumping port 230 is formed through the sidewalls 206 of the chamber body 202 and is connected to the chamber volume 204. A pumping device (not shown) is coupled through the pumping port 230 to the chamber volume 204 to evacuate and control the pressure therein. The pumping device may include one or more pumps and throttle valves.

A gas panel 240 is coupled by a gas line 242 to the chamber body 202 to supply process gases into the chamber volume 204. The gas panel 240 may include one or more process gas sources 244, 246, 248, 250 and may additionally include inert gases, non-reactive gases, and reactive gases. Examples of process gases that may be provided by the gas panel 240 include, but are not limited to, fluoroform ($CHF_3$), carbon tetrafluoride ($CF_4$), oxygen ($O_2$), chlorine ($Cl_2$), hydrogen bromide (HBr), nitrogen ($N_2$), argon (Ar), and methane ($CH_4$). The process gases may include other gases, such as inert or carrier gases.

Valves 252 control the flow of the process gases from the process gas sources 244, 246, 248, 250 from the gas panel 240 and are managed by a controller 254. The flow of the gases supplied to the chamber body 202 from the gas panel 240 may include combinations of the gases.

The chamber lid assembly 214 may include a nozzle 256. The nozzle 256 has one or more ports for introducing the process gases from the process gas sources 244, 246, 248, 250 of the gas panel 240 into the chamber volume 204. After the process gases are introduced into the etching processing chamber 200, the gases are energized to form plasma. An antenna 260, such as one or more inductor coils, may be provided adjacent to the etching processing chamber 200. An antenna power supply 262 may power the antenna 260 through a match circuit 264 to inductively couple energy, such as radio frequency (RF) energy, to the process gas to maintain a plasma formed from the process gas in the chamber volume 204 of the etching processing chamber 200. Alternatively, or in addition to the antenna power supply 262, process electrodes below the substrate 20 and/or above the substrate 20 may be used to capacitively couple RF power to the process gases to maintain the plasma within the chamber volume 204. The operation of the antenna power supply 262 may be controlled by a controller, such as controller 254, that also controls the operation of other components in the etching processing chamber 200.

The chamber lid assembly 214 further includes a window 266, which may be a transparent dielectric material, such as quartz. An OES measurement device 268 is positioned at the window 266. The OES measurement device 268 includes an emitter and a sensor. The emitter can emit one or more wavelengths of light through the window 266 into the etching processing chamber 200. The light from the emitter can be reflected off of gases and/or the substrate 20 in the etching processing chamber 200. Reflected light can be transmitted through the window 266 and received by the sensor of the OES measurement device 268. The reflected light detected by the sensor can be used to determine an end point of an etch process according to a given recipe. For example, the OES measurement device 268 is communicatively coupled to the controller 254 to transmit the detected reflected light to the controller 254 so that the controller 254 is capable of determining the end point.

A substrate support pedestal 270 is disposed in the chamber volume 204 to support the substrate 20 during processing. The substrate support pedestal 270 may include an electro-static chuck (ESC) 272 for holding the substrate 20 during processing. The ESC 272 uses the electro-static attraction to hold the substrate 20 to the substrate support pedestal 270. The ESC 272 includes an electrode 274 powered by a power source 276. The electrode 274 is embedded in the ESC 272 within a dielectric body. The power source 276 may also include a system controller for controlling the operation of the electrode 274 by directing a DC current to the electrode 274 for chucking and de-chucking the substrate 20.

Furthermore, the electrode 274 may further be coupled to an RF power supply 280 integrated with a match circuit 282. The RF power supply 280 may provide a RF bias voltage, for example, of about 200 volts to about 2000 volts to the electrode 274. Furthermore, the RF power supply 280 provides a bias which attracts plasma ions, formed by the process gases in the chamber volume 204, to the ESC 272 and substrate 20 positioned thereon. The RF power supply 280 may cycle on and off, or pulse, during processing of the substrate 20. The ESC 272 has an isolator 284 for the purpose of making the sidewall of the ESC 272 less attractive to the plasma to prolong the maintenance life cycle of the ESC 272. Additionally, the substrate support pedestal 270 may have a cathode liner 286 to protect the sidewalls of the substrate support pedestal 270 from the plasma gases and to extend the time between maintenance of the etching processing chamber 200.

The ESC 272 may include heaters disposed therein and connected to a power source (not shown), for heating the substrate, while a cooling base 288 supporting the ESC 272 may include conduits for circulating a heat transfer fluid to maintain a temperature of the ESC 272 and substrate 20 disposed thereon. The ESC 272 is configured to perform in the temperature range required by the thermal budget of the device being fabricated on the substrate 20. For example, the ESC 272 may be configured to maintain the substrate 20 at a temperature of about minus about 35 degrees Celsius to about 500 degrees Celsius for certain embodiments.

The cooling base 288 is provided to assist in controlling the temperature of the substrate 20. To mitigate process drift over time, the temperature of the substrate 20 may be maintained substantially constant by the cooling base 288 throughout the process of etching the substrate 20 in the etching processing chamber 200. In an embodiment, the temperature of the substrate 20 is maintained throughout an etch process at about 70 degrees Celsius to about 90 degrees Celsius.

A cover ring 290 is disposed on the ESC 272 and along the periphery of the substrate support pedestal 270. The cover ring 290 is configured to confine etching gases to a desired portion of the exposed top surface of the substrate 20, while shielding the top surface of the substrate support pedestal 270 from the plasma environment inside the etching processing chamber 200. Lift pins (not shown) are selectively moved through the substrate support pedestal 270 to lift the substrate 20 above the substrate support pedestal 270 to facilitate access to the substrate 20 by a transfer robot (not shown) or other suitable transfer mechanism.

The controller 254 may be utilized to control the process sequence, regulating the gas flows from the gas panel 240 into the etching processing chamber 200 and other process parameters. Software routines, when executed by the CPU, transform the CPU into a specific purpose computer (controller) that controls the etching processing chamber 200 such that the processes are performed. The software routines may also be stored and/or executed by a second controller (not shown) that is co-located with the etching processing chamber 200.

The substrate 20 has various layers disposed thereon which may include various metal layers, etch stop layers, and mask layers, such as described in the foregoing examples. The various layers may require etch recipes that are unique for the different compositions of each of the other film layers disposed on the substrate 20. These recipes may be performed in a single etching processing chamber or across several etch processing chambers. Each etching processing chamber may be configured to etch with one or more of the etch recipes. In an embodiment, the etching processing chamber 200 is configured to at least etch a metal layer to form an interconnect structure, such as a dual subtractive etch structure described above. For processing parameters provided herein, the etching processing chamber 200 is configured to process a 200 mm diameter substrate (e.g., a substrate having a plan area of about 0.0707 $m^2$), 300 mm diameter substrate, or a 450 mm diameter substrate. The process parameters, such as flow and power, may generally be scaled proportionally with the change in the chamber volume or substrate plan area.

FIG. 24 is a schematic top-view diagram of an example multi-chamber processing system 300 having the etching processing chamber 200 coupled thereto, which can be adapted to perform processes described herein. The system 300 can include one or more load lock chambers 302, 304 for transferring substrates into and out of the system 300. Typically, since the system 300 is under vacuum, the load lock chambers 302, 304 can "pump down" the substrates being introduced into the system 300. A first robot 310 can transfer the substrates between the load lock chambers 302, 304, and a first set of one or more substrate processing chambers 312, 314, 316, 200 (four are shown). Each of the substrate processing chambers 312, 314, 316, 200 is configured to perform at least one of substrate processing operation, such as an etching process, cyclical layer deposition (CLD), atomic layer deposition (ALD), CVD, PVD, degas, pre-cleaning, orientation and other substrate processes. The position of the etching processing chamber 200 utilized to perform the etching process relative to the other substrate processing chambers 312, 314, 316 is for illustration, and the position of the etching processing chamber 200 may optionally be switched with any one of the substrate processing chambers 312, 314, 316.

The first robot 310 can also transfer substrates to/from one or more transfer chambers 320, 322. The transfer chambers 320, 322 can be used to maintain ultra-high vacuum conditions while allowing substrates to be transferred within the system 300. A second robot 330 can transfer the substrates between the transfer chambers 320, 322 and a second set of one or more substrate processing chambers 332, 334, 336, 338. Similar to substrate processing chambers 312, 314, 316, 200, the substrate processing chambers 332, 334, 336, 338 can be outfitted to perform a variety of substrate processing operations including the dry etch processes described herein any other suitable process including deposition, pre-clean, degas, and orientation, for example. Any of the substrate processing chambers 312, 314, 316, 200, 332, 334, 336, 338 can be removed from the system 300, for example, if not necessary for a particular process to be performed by the system 300.

While the foregoing is directed to embodiments of the present disclosure, other and further embodiments of the disclosure may be devised without departing from the basic scope thereof, and the scope thereof is determined by the claims that follow.

The invention claimed is:

1. A method for semiconductor processing, the method comprising:
    forming a first titanium nitride layer over a substrate;
    forming a first ruthenium layer over the substrate;
    forming a second titanium nitride layer over the first ruthenium layer;
    forming a second ruthenium layer over the second titanium nitride layer;
    forming a hardmask layer over the first titanium nitride layer;
    patterning the hardmask layer into a first pattern;
    transferring the first pattern to the first titanium nitride layer comprising etching the first titanium nitride layer; and
    after transferring the first pattern to the first titanium nitride layer, removing the hardmask layer comprising performing an oxygen-containing ash process.

2. The method of claim 1 further comprising:
    after removing the hardmask layer, transferring the first pattern to the first ruthenium layer comprising etching the first ruthenium layer.

3. The method of claim 2, wherein etching the first ruthenium layer comprises providing a gas mixture comprising oxygen and chlorine to the first ruthenium layer, a ratio of (i) a flow rate of oxygen to (ii) the flow rate of the oxygen plus a flow rate of chlorine being in a range from 82% to 95%.

4. The method of claim 2 further comprising:
    forming a second titanium nitride layer over the substrate, the first ruthenium layer being formed over the second titanium nitride layer;
    forming an oxide layer over the first titanium nitride layer, the hardmask layer being formed over the oxide layer; and
    transferring the first pattern to the oxide layer; and
    wherein etching the first ruthenium layer comprises using an etch process having an etch selectivity of ruthenium to titanium nitride of 50 or more and having an etch selectivity of ruthenium to oxide of 30 or more.

5. The method of claim 2, wherein etching the first ruthenium layer comprises:
    initiating flowing of etch process gases provided to the first ruthenium layer at a first time;
    determining an end point at a second time using optical emission spectrometry, the end point being determined based on a decrease of a detected optical signal;
    continuing flowing of the etch process gases for an over-etch period after the second time, the over-etch period being in a range from 10% to 100% of a duration from the first time to the second time; and
    terminating flowing of the etch process gases at a conclusion of the over-etch period.

6. The method of claim 2, wherein transferring the first pattern to the first ruthenium layer forms a ruthenium pattern having a profile with vertical sidewalls.

7. The method of claim 1 further comprising:
    after removing the hardmask layer, transferring a line pattern to the second ruthenium layer;
    simultaneously patterning the first titanium nitride layer into a via pattern and transferring the line pattern to the second titanium nitride layer;
    simultaneously transferring the via pattern to the second ruthenium layer to form a via and transferring the line pattern to the first ruthenium layer to form a line; and
    forming a dielectric layer on the line and the via, wherein the first titanium nitride layer being formed over the second ruthenium layer, the first pattern being the line pattern.

8. The method of claim 1 further comprising, after removing the hardmask layer, depositing a layer over the first titanium nitride layer.

9. A method for semiconductor processing, the method comprising:
    depositing a first ruthenium layer over a substrate;
    depositing a second ruthenium layer over the substrate;
    depositing a first titanium nitride layer over the second ruthenium layer, wherein the first ruthenium layer is deposited over the first titanium nitride layer;
    depositing a second titanium nitride layer over the first ruthenium layer; and
    etching the first ruthenium layer comprising:
        initiating, at a first time, flowing of a mixture of gases to a chamber in which the first ruthenium layer is disposed, the mixture of gases comprising oxygen and chlorine;
        determining an end point at a second time using optical emission spectrometry, the end point being determined based on a decrease of a detected optical signal;
        continuing flowing of the mixture of gases for an over-etch period after the second time, the over-etch period being in a range from 10% to 100% of a duration from the first time to the second time; and
        terminating flowing of the mixture of gases at a conclusion of the over-etch period.

10. The method of claim 9, wherein the over-etch period is in a range from greater than 20% to less than or equal to 100% of the duration from the first time to the second time.

11. The method of claim 9, wherein flowing the mixture of gases includes:
    flowing oxygen at a rate in a range from 300 standard cubic centimeter per minute (sccm) to 500 sccm; and
    flowing chlorine at a rate in a range from 10 sccm to 50 sccm.

12. The method of claim 9 further comprising:
    depositing a titanium nitride layer over the substrate, the first ruthenium layer being deposited over the titanium nitride layer;
    depositing an oxide layer over the first ruthenium layer; and
    wherein the mixture of gases has an etch selectivity of ruthenium to titanium nitride of 50 or more and has an etch selectivity of ruthenium to oxide of 30 or more.

13. The method of claim 9, wherein etching the first ruthenium layer forms a ruthenium pattern having a profile with vertical sidewalls.

14. The method of claim 9 further comprising:
    forming a titanium nitride layer over the first ruthenium layer;

forming a hardmask layer over the titanium nitride layer;
patterning the hardmask layer into a pattern;
transferring the pattern to the titanium nitride layer; and
after transferring the pattern to the titanium nitride layer, removing the hardmask layer comprising performing an oxygen-containing ash process, wherein the first ruthenium layer is etched after the hardmask layer is removed, etching the first ruthenium layer includes transferring the pattern to the first ruthenium layer.

15. The method of claim 9 further comprising:
etching the second titanium nitride layer to form a line pattern, wherein etching the first ruthenium layer transfers the line pattern to the first ruthenium layer;
simultaneously etching the second titanium nitride layer to form a via pattern and etching the first titanium nitride layer to transfer the line pattern to the first titanium nitride layer;
simultaneously etching the first ruthenium layer to transfer the via pattern to the first ruthenium layer and etching the second ruthenium layer to transfer the line pattern to the second ruthenium layer, wherein a via is formed in the first ruthenium layer, and a line is formed in the second ruthenium layer; and
depositing a dielectric layer on the line and the via.

16. A method for semiconductor processing, the method comprising:
forming a first ruthenium layer over a substrate;
forming a first etch stop layer over the first ruthenium layer;
forming a second ruthenium layer over the first etch stop layer;
forming a second etch stop layer over the second ruthenium layer;
forming a mask layer over the second etch stop layer;
forming a hardmask layer over the mask layer;
patterning the hardmask layer and the mask layer to a line pattern;
transferring the line pattern to the second etch stop layer;
after transferring the line pattern to the second etch stop layer, removing the hardmask layer using an oxygen-containing ash process;
after removing the hardmask layer, transferring the line pattern to the second ruthenium layer comprising etching the second ruthenium layer using a gas mixture comprising oxygen and chlorine, wherein, in the gas mixture, a ratio of (i) a flow rate of oxygen to (ii) the flow rate of the oxygen plus a flow rate of chlorine is in a range from 82% to 95%;
simultaneously patterning the second etch stop layer to a via pattern and transferring the line pattern to the first etch stop layer;
simultaneously transferring the via pattern to the second ruthenium layer to form a via and transferring the line pattern to the first ruthenium layer to form a line; and
forming a dielectric on the via and line.

17. The method of claim 16, wherein etching the second ruthenium layer comprises:
initiating flowing of the gas mixture provided to the second ruthenium layer at a first time;
determining an end point at a second time using optical emission spectrometry, the end point being determined based on a decrease of a detected optical signal;
continuing flowing of the gas mixture for an over-etch period after the second time, the over-etch period being in a range from 10% to 100% of a duration from the first time to the second time; and
terminating flowing of the gas mixture at a conclusion of the over-etch period.

18. The method of claim 16, wherein the line and the via have aligned sidewalls.

19. The method of claim 16, wherein each of the first etch stop layer and the second etch stop layer is a titanium nitride layer.

20. The method of claim 19, wherein:
the mask layer is an oxide layer; and
the gas mixture has an etch selectivity of ruthenium to titanium nitride of 50 or more and has an etch selectivity of ruthenium to oxide of 30 or more.

\* \* \* \* \*